United States Patent
Wu

(10) Patent No.: US 9,583,726 B2
(45) Date of Patent: Feb. 28, 2017

(54) LIGHT-EMITTING DIODE AND ELECTRONIC DEVICE

(71) Applicant: BOE TECHNOLOGY GROUP CO., LTD., Beijing (CN)

(72) Inventor: Changyen Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 63 days.

(21) Appl. No.: 14/437,156

(22) PCT Filed: Aug. 18, 2014

(86) PCT No.: PCT/CN2014/084736
§ 371 (c)(1),
(2) Date: Apr. 20, 2015

(87) PCT Pub. No.: WO2015/158085
PCT Pub. Date: Oct. 22, 2015

(65) Prior Publication Data
US 2016/0336525 A1  Nov. 17, 2016

(30) Foreign Application Priority Data

Apr. 14, 2014  (CN) .......................... 2014 1 0149131

(51) Int. Cl.
*H01L 29/06* (2006.01)
*H01L 51/50* (2006.01)
*H01L 51/52* (2006.01)

(52) U.S. Cl.
CPC ............ *H01L 51/502* (2013.01); *H01L 51/50* (2013.01); *H01L 51/5056* (2013.01); *H01L 51/5072* (2013.01); *H01L 51/52* (2013.01)

(58) Field of Classification Search
CPC ... H01L 51/502; H01L 51/5072; H01L 51/52; H01L 51/5056
USPC .......................................................... 257/13
See application file for complete search history.

(56) References Cited

U.S. PATENT DOCUMENTS

2010/0224859 A1* 9/2010 Gough .................. B82Y 20/00
                                                              257/13
2012/0032138 A1  2/2012 Kim et al.

FOREIGN PATENT DOCUMENTS

| CN | 1886844 A | 12/2006 |
|---|---|---|
| CN | 101889480 A | 11/2010 |
| CN | 101937975 A | 1/2011 |
| CN | 103500803 A | 1/2014 |

(Continued)

OTHER PUBLICATIONS

Decision of Rejection regarding Chinese application No. 201410149131.6, dated Jun. 12, 2015. Translation provided by Dragon Intellectual Property Law Firm.

(Continued)

*Primary Examiner* — Anthony Ho
(74) *Attorney, Agent, or Firm* — Harness, Dickey & Pierce, P.L.C.

(57) ABSTRACT

The present disclosure relates to the field of semiconductor device, and provides a light-emitting diode and an electronic device. The light-emitting diode includes a first electrode and a second electrode arranged opposite to each other, and a light-emitting layer arranged between the first electrode and the second electrode. The light-emitting layer includes quantum dots and at least one organic light-emitting material.

18 Claims, 2 Drawing Sheets

(56) References Cited

FOREIGN PATENT DOCUMENTS

CN  103956432 A  7/2014

OTHER PUBLICATIONS

Chinese Notification of Reexamination regarding Application No. 2014101491316 dated Feb. 24, 2016. Translation provided by Dragon Intellectual Property Law Firm.
International Search Report and Written Opinion mailed Jan. 20, 2015 regarding PCT/CN2014/084736. Translation provided by Dragon Intellectual Property Law Firm.
Chinese Office Action mailed Dec. 8, 2014 regarding Chinese Application No. 201410149131.6. Translation provided by Dragon Intellectual Property Law Firm.

* cited by examiner

LIGHT-EMITTING DIODE AND ELECTRONIC DEVICE

CROSS-REFERENCE TO RELATED APPLICATIONS

The present application is the U.S. national phase of PCT Application No. PCT/CN2014/084736 filed on Aug. 19, 2014, which claims a priority of the Chinese patent application No. 201410149131.6 filed on Apr. 14, 2014, the disclosures of which are incorporated herein by reference in their entirety.

TECHNICAL FIELD

The present disclosure relates to the field of semiconductor device, in particular to a light-emitting diode and an electronic device.

BACKGROUND

Currently, a white organic light-emitting diode (OLED) includes various structures, such as a laminated structure consisting of a plurality of elements, a color conversion structure, a structure including a single light-emitting layer, and a structure consisting of several light-emitting layers. The structure consisting of several light-emitting layers has been widely used in the white OLED due to its simple manufacturing process and excellent color stability.

As shown in FIG. 1, a conventional OLED with the structure of several light-emitting layers includes a cathode, an anode, and several organic light-emitting layers arranged between the cathode and the anode. As its working principle, when a forward bias voltage derived from a direct current (DC) is applied to an element, electrons and holes are driven by such an additional voltage into the organic light-emitting layers via the cathode and the anode, respectively. When organic molecules with an unstable excitation state are changed from an excitation state to a ground state, a luminescent phenomenon occurs. After the organic molecules are excited by external energy, the organic molecules are in a singlet state when the excitation-state electrons and ground-state electrons have paired electron spin, and the light generated thereby is just the so-called fluorescence. In contrast, when the excitation-state electrons and the ground-state electrons have parallel electron spin, the organic molecules are in a triplet state, and the light generated thereby is just the so-called phosphorescence. The phosphorescence OLED is four times the light-emitting efficiency of the fluorescence OLED, and thus has been widely used nowadays.

Phosphorescent materials capable of being excited to emit red light, yellow light and green light have excellent characteristics, and various materials are available for selection, so they have recently been putted into mass production. However, a phosphorescent material capable of being excited to emit blue light is not commercially available. As a result, in the white OLED with the structure consisting of several light-emitting layers, a fluorescent material used to emit the blue light, has a low blue light-emitting efficiency, which result in the low light-emitting efficiency of the white OLED. Of course, the fluorescent material with a low light-emitting efficiency may also be a material capable of being excited to emit the light in other colors.

SUMMARY

An object of the present disclosure is to provide a light-emitting diode and an electronic device, so as to prevent a low light-emitting efficiency for an OLED caused when a fluorescent material with a low light-emitting efficiency is used.

In one aspect, the present disclosure provides in embodiments a light-emitting diode, including a first electrode and a second electrode arranged opposite to each other, and a light-emitting layer arranged between the first electrode and the second electrode, wherein the light-emitting layer includes quantum dots and at least one organic light-emitting material.

Alternatively, the quantum dot emits a light beam in a color different from the organic light-emitting material.

Alternatively, the quantum dot emits a light beam in a color identical to the at least one organic light-emitting material.

Alternatively, the light-emitting diode includes a first carrier transport layer and a second carrier transport layer, wherein the first carrier transport layer, the light-emitting layer and the second carrier transport layer are sequentially arranged between the first electrode and the second electrode.

Alternatively, the light-emitting layer is of a single-layered structure.

Alternatively, in the light-emitting layer, an absolute value of a highest occupied molecular orbital energy level of the organic light-emitting material is greater than an absolute value of a valence band of the quantum dot, and an absolute value of a lowest unoccupied molecular orbital energy level of the organic light-emitting material is less than an absolute value of a conduction band of the quantum dot.

Alternatively, the quantum dots and the organic light-emitting material are formed simultaneously by a single film-forming process.

Alternatively, the light-emitting layer includes a first surface and a second surface opposite to each other.

Alternatively, the light-emitting layer includes a first organic light-emitting layer, a second organic light-emitting layer, and a quantum dot layer arranged between the first organic light-emitting layer and the second organic light-emitting layer.

Alternatively, the quantum dot layer is of a thickness of less than 10 nm.

Alternatively, the organic light-emitting material is a phosphorescent material.

Alternatively, the phosphorescent material is a platinum-porphyrin complex, picolinatoiridium, tris (phenylpyridine) iridium, or acetylacetonato bis (2-phenylpyridine) iridium.

In another aspect, the present disclosure provides in embodiments an electronic device including the above-mentioned light-emitting diode.

Alternatively, the electronic device is a display device or a backlight unit for use in a liquid crystal display device.

According to embodiments of the present disclosure, the light-emitting layer of the light-emitting diode includes the quantum dots and the at least one organic light-emitting material. As the quantum dots have a light-emitting efficiency identical to the phosphorescent material, the quantum dots are used to replace or compensate for the fluorescent material with a low light-emitting efficiency so as to emit the light beam in the desired color, so it is able to improve the light-emitting efficiency of the light-emitting diode. In addition, a process for manufacturing the quantum dots is compatible with that for manufacturing the organic light-emitting material, so a simple manufacturing process is provided.

BRIEF DESCRIPTION OF THE DRAWINGS

In order to illustrate the technical solutions in embodiments of the present disclosure or the related art in a more apparent manner, the drawings desired for them will be described hereinafter briefly. Obviously, the following drawings merely relate to some embodiments of the present disclosure, and based on these drawings, a person skilled in the art may obtain the other drawings without any creative effort.

DETAILED DESCRIPTION

In the related art, for light beams from an OLED, the light beam in a certain color can merely be emitted by a fluorescent material with a low light-emitting efficiency, so the light-emitting efficiency of the OLED is low accordingly. In order to overcome this drawback, the present disclosure provides in embodiments a light-emitting diode, which includes a first electrode and a second electrode arranged opposite to each other, and a light-emitting layer arranged between the first electrode and the second electrode, in which the light-emitting layer includes quantum dots and at least one organic light-emitting material. The organic light-emitting material may be a phosphorescent material. As the quantum dots have a light-emitting efficiency identical to the phosphorescent material, the quantum dots are used to replace or compensate for the fluorescent material with a low light-emitting efficiency so as to emit the light beam in the desired color (the light beam in the color emitted when the fluorescent material is excited), so it is able to improve the light-emitting efficiency of the light-emitting diode. In addition, a process for manufacturing the quantum dots is compatible with that for manufacturing the organic light-emitting material, so a simple manufacturing process is provided. The present disclosure will be described hereinafter in conjunction with the drawings and embodiments. The following embodiments are for illustrative purposes only, but shall not be used to limit the scope of the present disclosure.

According to embodiments of the present disclosure, the first electrode is an anode and the second electrode is a cathode.

Embodiment 1

Figure 1:
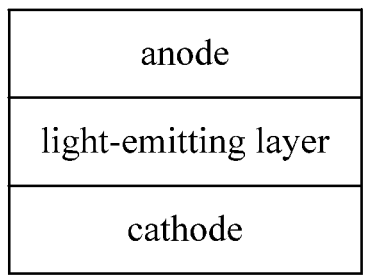
FIG. 1 is a schematic view showing an OLED in the related art.
Figure 2:
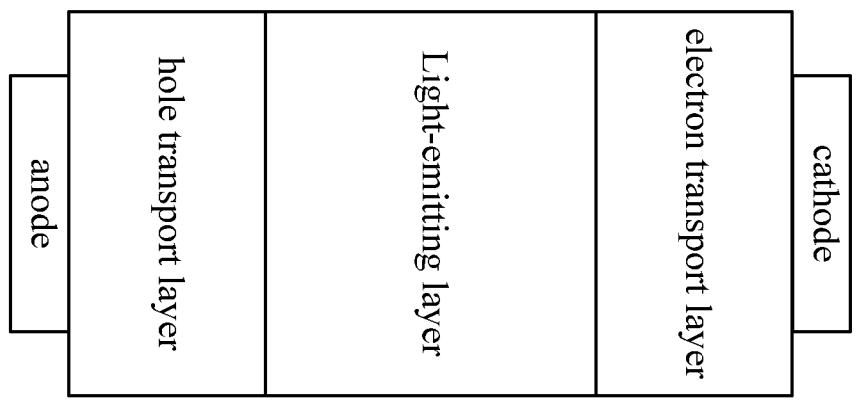
FIG. 2 is a schematic view showing a light-emitting diode according to an embodiment of the present disclosure.
Figure 3:
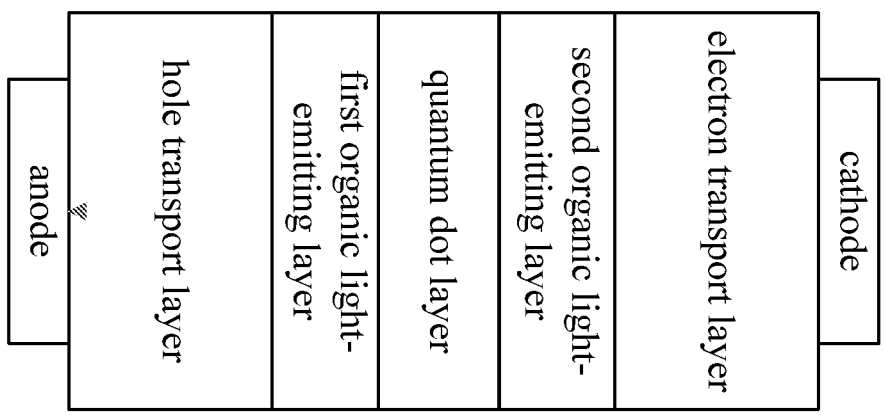
FIG. 3 is another schematic view showing a light-emitting diode according to an embodiment of the present disclosure.

As shown in FIGS. 2 and 3, the light-emitting diode in this embodiment includes a first electrode and a second electrode arranged opposite to each other, and a light-emitting layer arranged between the first electrode and the second electrode. In order to enhance the carrier transport performance of the light-emitting diode, the light-emitting diode further includes a first carrier transport layer (specifically, a hole transport layer arranged between the first electrode and the light-emitting layer) and a second carrier transport layer (specifically, an electron transport layer arranged between the second electrode and the light-emitting layer). The light-emitting layer includes a first surface and a second surface opposite to each other. The hole transport layer, the light-emitting layer and the electron transport layer are arranged sequentially. The hole transport layer is electrically connected to the anode, and the carriers (holes) are injected into the light-emitting layer through the first surface. The electron transport layer is electrically connected to the cathode, and the carriers (electrons) are injected into the light-emitting layer through the second surface. The light-emitting layer includes quantum dots and at least one organic light-emitting material. Of course, in order to enhance the light-emitting performance of the light-emitting diode, it may further include, in accordance with the practical need, any other functional layers such as an electron injection layer and a hole injection layer. In other words, the structure of the light-emitting diode is not particularly defined herein.

The quantum dot is a quasi-zero-dimensional nano material and includes a small amount of atoms. Roughly speaking, the quantum dot has its sizes in three dimensions less than 100 nm, and it looks like a tiny, dot-like substance. The movement of electrons inside the quantum dot in the respective directions is limited, so its quantum confinement effect is particularly significant. By controlling a shape, a structure and a size of the quantum dot, it is able to conveniently adjust a width of its energy gap and a size of its exciton binding energy, and change a color of the light beam emitted thereby. This is just referred to as "quantum size effect". Along with a decrease in a particle size of the quantum dot, a majority of the atoms are distributed at a surface of the quantum dot and a specific surface area of the quantum dot increases. Due to the large specific surface area of the nano particle, the number of surface phase atoms increases, which results in insufficient coordination for the surface phase atoms as well as an increase in unsaturated bonds and dangling bonds. These surface phase atoms have high activity and are extremely unstable, and thus can readily be bonded to the other atoms. This is just referred to as "surface effect of quantum dot".

Hence, an emission spectrum of the quantum dot may be controlled by changing its size. Through changing the size of the quantum dot and the chemical composition thereof, it may enable the emission spectrum to cover an entire visible region. By taking a CdTe-based quantum dot as an example, when its particle size increases from 2.5 nm to 4.0 nm, it may observe a red shift of emission wavelength from 510 nm to 660 nm. In addition, the quantum dot may capture the carriers (including electrons and holes) passing therethrough, so it has poor carrier transport capability.

According to embodiments of the present disclosure, the light-emitting layer of the light-emitting diode includes the quantum dots and the at least one organic light-emitting material. As the quantum dots have a light-emitting efficiency identical to the phosphorescent material, the quantum dots are used to replace or compensate for the fluorescent material with a low light-emitting efficiency to emit the light beam in the desired color, so it is able to improve the light-emitting efficiency of the light-emitting diode. In addition, a process for manufacturing the quantum dots is compatible with that for manufacturing the organic light-emitting material, so a simple manufacturing process is provided. Moreover, due to the poor carrier transport capability of the quantum dot, the carriers are transported through the organic light-emitting material, so as to prevent the carriers from being captured by the quantum dot, thereby to achieve electron-hole recombination. As a result, when the light is emitted by the quantum dot, the organic light-emitting material may emit light too.

Alternatively, the quantum dot may emit a light beam in a color different from the organic light-emitting material, and it may replace the fluorescent material with a low light-emitting efficiency so as to emit the light beam in the desired color, thereby to improve the light-emitting efficiency. Alternatively, the quantum dot may emit a light beam in a color identical to the at least one organic light-emitting material (especially the fluorescent material with a low light-emitting efficiency), so it may compensate for the fluorescent material so as to emit the light beam in the desired color, thereby to improve the color saturation as well as the light-emitting efficiency.

In an embodiment, the light-emitting layer is of a single-layered structure, as shown in FIG. 2. The quantum dot and the at least one organic light-emitting material may be formed simultaneously by a single film-forming process (an evaporation process).

Alternatively, in order to enhance the carrier transport characteristics, in the light-emitting layer, an absolute value of a highest occupied molecular orbital (HOMO) energy level (an energy band for hole transport) of the organic light-emitting material is greater than an absolute value of a valence band of the quantum dot, so as to prevent the hole from being captured by the quantum dot and to transport the hole through the organic light-emitting material. In addition, an absolute value of a lowest unoccupied molecular orbital (LUMO) energy level (an energy band for electron transport) of the organic light-emitting material is less than an absolute value of a conduction band of the quantum dot, so as to prevent the electron from being captured by the quantum dot and to transport the electron through the organic light-emitting material.

In another embodiment, the light-emitting layer is of a multi-layered structure, including a first organic light-emitting layer, a second organic light-emitting layer and a quantum dot layer arranged between the first organic light-emitting layer and the second organic light-emitting layer, as shown in FIG. 3. To be specific, the organic light-emitting material (including at least one organic light-emitting material) is processed by a single evaporation process so as to form the first organic light-emitting layer. Then, the quantum dot layer is formed at a surface of the first organic light-emitting layer (i.e., a surface opposite to the first surface of the light-emitting layer). Finally, the organic light-emitting material is processed by a single evaporation process so as to form the second organic light-emitting layer at a surface of the quantum dot layer. A surface of the second organic light-emitting layer is just the second surface of the light-emitting layer. The electrons from an electron transport layer are injected into the second organic light-emitting layer through the second surface of the light-emitting layer, and the holes from a hole transport layer are injected into the first organic light-emitting layer through the first surface of the light-emitting layer.

Alternatively, as the quantum dot has poor carrier transport capability and its energy level may not match an energy level of the organic light-emitting layer (i.e., the absolute value of the highest occupied molecular orbital energy level of the organic light-emitting material is greater than the absolute value of the valence band of the quantum dot, and the absolute value of the lowest unoccupied molecular orbital energy level of the organic light-emitting material is less than the absolute value of the conduction band of the quantum dot). In order to improve the carrier transport characteristics, in the light-emitting layer, the quantum dot layer is of a very small thickness in a carrier transport direction, alternatively less than 10 nm, so that the quantum dot layer may drive the carriers to pass through the first organic light-emitting layer and the second organic light-emitting layer. In addition, due to the thin quantum dot layer, the chance for the carriers to pass through the quantum dot layer increases, so as to enable a region where the electrons and the holes are recombined to be limited to the first organic light-emitting layer and the second organic light-emitting layer, thereby to enable the organic light-emitting material to emit the light.

Alternatively, the organic light-emitting material is a phosphorescent material, e.g., a red phosphorescent material such as platinum-porphyrin complex (PtOET), a blue phosphorescent material such as picolinatoiridium, tris (phenylpyridine) iridium (FIrpic), or a green phosphorescent material such as tris (phenylpyridine) iridium (Ir (ppy)$_3$) and acetylacetonato bis (2-phenylpyridine) iridium (Ir(ppy)$_2$(acac)), so as to improve the light-emitting efficiency.

Figure 4:
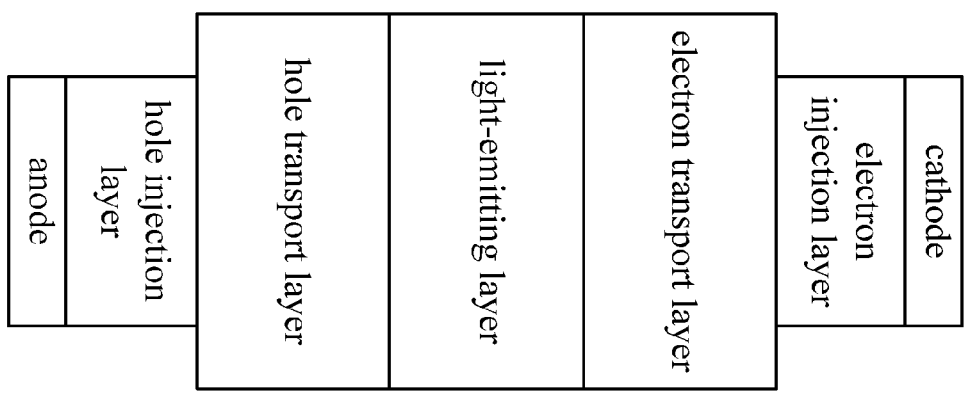
FIG. 4 is yet another schematic view showing a light-emitting diode according to an embodiment of the present disclosure.

Correspondingly, in an embodiment of the present disclosure, when the light-emitting layer is of a single-layered structure as shown in FIG. 4, the quantum dots and the at least one phosphorescent material may be formed simultaneously by a single film-forming process (e.g., an evaporation process). The absolute value of the HOMO energy level of the phosphorescent material is greater than the absolute value of the valence band of the quantum dot so as to transport the holes, and the absolute value of the LUMO energy level of the phosphorescent material is less than the absolute value of the conduction band of the quantum dot so as to transport the electrons. As the phosphorescence OLED has a high light-emitting efficiency, in order to provide sufficient carriers, it is required to provide a hole injection layer arranged between the electron transport layer and the anode as well as an electron injection layer arranged between the electron transport layer and the cathode.

Figure 5:
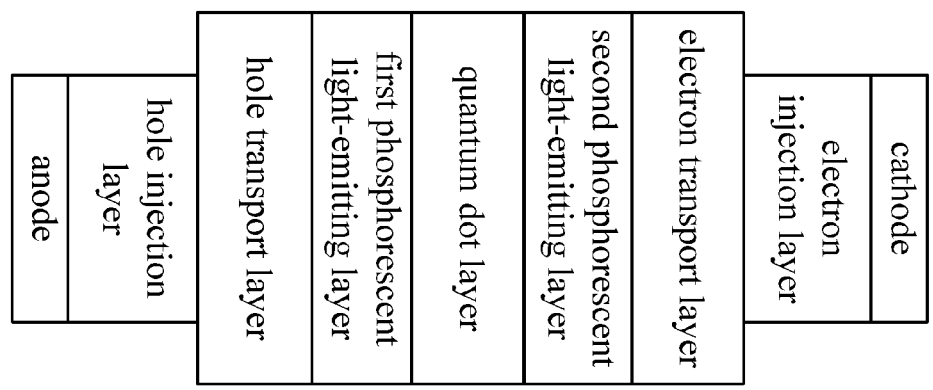
FIG. 5 is still yet another schematic view showing a light-emitting diode according to an embodiment of the present disclosure.

In another embodiment of the present disclosure, when the light-emitting layer is of a multi-layered structure as shown in FIG. 5, the light-emitting layer includes a first phosphorescent light-emitting layer, a second phosphorescent light-emitting layer, and a quantum dot layer arranged between the first phosphorescent light-emitting layer and the second phosphorescent light-emitting layer. To be specific, the phosphorescent material (including at least one phosphorescent material) is processed by a single evaporation process to form the first phosphorescent light-emitting material. Then, the quantum dot layer is formed at a surface of the first phosphorescent light-emitting layer (i.e., a surface opposite to the first surface of the light-emitting layer). Finally, the phosphorescent material is processed by a single evaporation process so as to form the second phosphorescent light-emitting layer at a surface of the quantum dot layer. A surface of the second phosphorescent light-emitting layer is just the second surface of the light-emitting layer, and the quantum dot layer is of a thickness of less than 10 nm. The electrons from the electron transport layer are injected into the second phosphorescent light-emitting layer through the second surface of the light-emitting layer, and the holes from the hole transport layer are injected into the first phosphorescent light-emitting layer through the first surface of the light-emitting layer. Similarly, in order to provide sufficient carriers, the phosphorescent OLED in this embodiment further includes a hole injection layer arranged between the hole transport layer and the anode as well as an electron injection layer arranged between the electron transport layer and the cathode.

Embodiment 2

The present disclosure provides in this embodiment an electronic device including the light-emitting diode in Embodiment 1. Because the light-emitting efficiency of the light-emitting diode is improved, it is able to enhance the performance of the electronic device. The electronic device may be a display device or a backlight unit for use in a liquid crystal display device.

The structure of the light-emitting diode is mentioned above and thus will not be repeated herein. In addition, the structures of the other components of the display device may refer to the related art, and they are not particularly defined herein. The display device may be a product or member having a display function, such as a digital photo frame, a mobile phone or a flat-panel computer.

According to the electronic device in this embodiment, the light-emitting layer of the light-emitting diode includes the quantum dots and the at least one organic light-emitting material. As the quantum dots have a light-emitting efficiency identical to the phosphorescent material, and the quantum dots are used to replace or compensate for the fluorescent material with a low light-emitting efficiency so as to emit the light beam in the desired color, so it is able to improve the light-emitting efficiency of the light-emitting diode. In addition, a process for manufacturing the quantum dots is compatible with that for manufacturing the organic light-emitting material, so a simple manufacturing process is provided.

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. A light-emitting diode, comprising a first electrode and a second electrode arranged opposite to each other, and a light-emitting layer arranged between the first electrode and the second electrode, wherein the light-emitting layer comprises quantum dots and at least one organic light-emitting material, and in the light-emitting layer, an absolute value of a highest occupied molecular orbital energy level of the organic light-emitting material is greater than an absolute value of a valence band of the quantum dot, and an absolute value of a lowest unoccupied molecular orbital energy level of the organic light-emitting material is less than an absolute value of a conduction band of the quantum dot.

2. The light-emitting diode according to claim 1, wherein the quantum dot emits a light beam in a color different from the organic light-emitting material.

3. The light-emitting diode according to claim 1, wherein the quantum dot emits a light beam in a color identical to the at least one organic light-emitting material.

4. The light-emitting diode according to claim 1, further comprising a first carrier transport layer and a second carrier transport layer, wherein the first carrier transport layer, the light-emitting layer and the second carrier transport layer are sequentially arranged between the first electrode and the second electrode.

5. The light-emitting diode according to claim 1, wherein the light-emitting layer is of a single-layered structure.

6. The light-emitting diode according to claim 5, wherein the quantum dots and the organic light-emitting material are formed simultaneously by a single film-forming process.

7. The light-emitting diode according to claim 5, wherein the light-emitting layer comprises a first surface and a second surface opposite to each other.

8. The light-emitting diode according to claim 1, wherein the light emitting layer comprises a first organic light-emitting layer, a second organic light-emitting layer, and a quantum dot layer arranged between the first organic light-emitting layer and the second organic light-emitting layer.

9. The light-emitting diode according to claim 8, wherein the quantum dot layer is of a thickness of less than 10 nm.

10. The light-emitting diode according to claim 1, wherein the organic light-emitting material is a phosphorescent material.

11. The light-emitting diode according to claim 10, wherein the phosphorescent material is a platinum-porphyrin complex, picolinatoiridium, tris (phenylpyridine) iridium, or acetylacetonato bis (2-phenylpyridine) iridium.

12. An electronic device, comprising the light-emitting diode according to claim 1.

13. The electronic device according to claim 12, wherein the electronic device is a display device or a backlight unit for use in a liquid crystal display device.

14. The electronic device according to claim 12, wherein the light-emitting layer is of a single-layered structure.

15. The electronic device according to claim 12, wherein the light emitting layer comprises a first organic light-emitting layer, a second organic light-emitting layer, and a quantum dot layer arranged between the first organic light-emitting layer and the second organic light-emitting layer.

16. The electronic device according to claim 15, wherein the quantum dot layer is of a thickness of less than 10 nm.

17. The electronic device according to claim 12, wherein the organic light-emitting material is a phosphorescent material.

18. The electronic device according to claim 17, wherein the phosphorescent material is a platinum-porphyrin complex, picolinatoiridium, tris (phenylpyridine) iridium, or acetylacetonato bis (2-phenylpyridine) iridium.

* * * * *